United States Patent
Lee (10) Patent No.: US 8,242,804 B2
(45) Date of Patent: Aug. 14, 2012

(54) IMPEDANCE CONTROL SIGNAL GENERATION CIRCUIT AND IMPEDANCE CONTROL METHOD OF SEMICONDUCTOR CIRCUIT

(75) Inventor: Geun Il Lee, Icheon-si (KR)

(73) Assignee: SK Hynix, Inc., Gyeonggi-do (KR)

( * ) Notice: Subject to any disclaimer, the term of this patent is extended or adjusted under 35 U.S.C. 154(b) by 0 days.

(21) Appl. No.: 12/983,200

(22) Filed: Dec. 31, 2010

(65) Prior Publication Data

US 2012/0081145 A1 Apr. 5, 2012

(30) Foreign Application Priority Data

Sep. 30, 2010 (KR) .................. 10-2010-0095660

(51) Int. Cl.
*H03K 19/003* (2006.01)
(52) U.S. Cl. ........................................ 326/30
(58) Field of Classification Search .................. None
See application file for complete search history.

(56) References Cited

U.S. PATENT DOCUMENTS

| | | | | |
|---|---|---|---|---|
| 6,380,758 B1* | 4/2002 | Hsu et al. | ......................... | 326/30 |
| 6,556,038 B2* | 4/2003 | Kim et al. | ........................ | 326/30 |
| 8,018,246 B2* | 9/2011 | Kaiwa et al. | .................... | 326/30 |
| 2002/0118037 A1* | 8/2002 | Kim et al. | ........................ | 326/30 |
| 2005/0040845 A1 | 2/2005 | Park | | |
| 2006/0158216 A1* | 7/2006 | Aoyama et al. | ................ | 326/30 |
| 2006/0261844 A1 | 11/2006 | Kim et al. | | |
| 2006/0290557 A1 | 12/2006 | Kurisu | | |
| 2007/0152704 A1* | 7/2007 | Park | ............................. | 326/30 |
| 2008/0048714 A1* | 2/2008 | Lee et al. | ........................ | 326/30 |
| 2008/0252332 A1* | 10/2008 | Lee et al. | ........................ | 326/30 |
| 2009/0121742 A1* | 5/2009 | Park | ............................. | 326/30 |
| 2010/0207680 A1 | 8/2010 | Kuwahara et al. | | |

FOREIGN PATENT DOCUMENTS

| | | |
|---|---|---|
| JP | 2006-079769 | 3/2006 |
| JP | 2007-123987 | 5/2007 |
| KR | 1020050101865 A | 10/2005 |
| KR | 1020090081229 A | 7/2009 |

* cited by examiner

*Primary Examiner* — Shawki S Ismail
*Assistant Examiner* — Crystal L Hammond
(74) *Attorney, Agent, or Firm* — William Park & Associates Ltd.

(57) ABSTRACT

An impedance control signal generation circuit includes an impedance control signal generation unit configured to generate an impedance control signal in response to a command, a storage unit configured to latch and output the impedance control signal in response to an update pulse signal, a control unit configured to determine whether the impedance control signal is within a predetermined range and generate an update enable signal according to a determination result, and a prohibition unit configured to control input of the update pulse signal to the storage unit in response to the update enable signal.

19 Claims, 5 Drawing Sheets

IMPEDANCE CONTROL SIGNAL GENERATION CIRCUIT AND IMPEDANCE CONTROL METHOD OF SEMICONDUCTOR CIRCUIT

CROSS-REFERENCES TO RELATED APPLICATION

The present application claims priority under 35 U.S.C. §119(a) to Korean application number 10-2010-0095660, filed on Sep. 30, 2010, in the Korean Intellectual Property Office, which is incorporated herein by reference in its entirety.

BACKGROUND

1. Technical Field

The present invention relates to a semiconductor circuit, and more particularly, to an impedance control signal generation circuit and an impedance control method of a semiconductor circuit.

2. Related Art

In a semiconductor circuit, the impedance of a data input/output driver has a value different from the original target value according to a variation in PTV (process, voltage, or temperature).

Accordingly, it is important to constantly maintain the impedance of the data input/output driver regardless of the PTV variation.

In the semiconductor circuit, the impedance of the data input/output driver is controlled according to an impedance control signal generated through an impedance control signal generation circuit.

Figure 1:
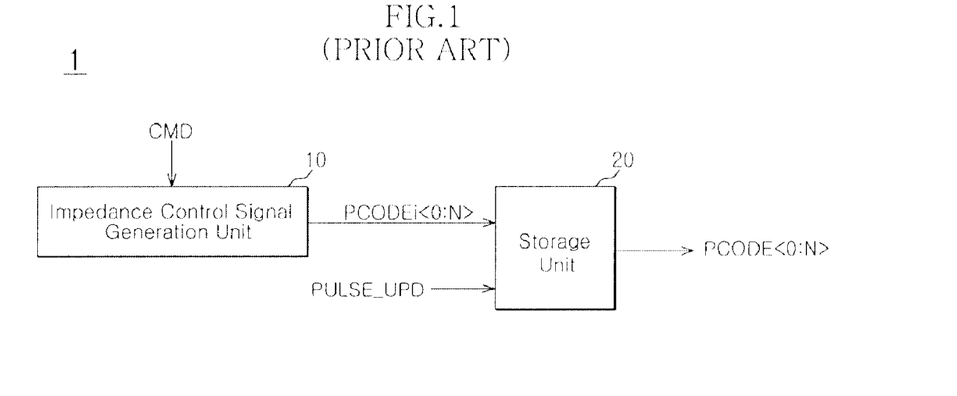
FIG. 1 is a block diagram of an impedance control signal generation circuit according to the conventional art.

Referring to FIG. 1, an impedance control signal generation circuit 1 according to the conventional art includes an impedance control signal generation unit 10 and a storage unit 20.

The impedance control signal generation unit 10 generates impedance control signals PCODEi<0:N> in response to an external command CMD.

The external command CMD may be generated in an initial system operation or an auto-refresh operation.

The impedance control signal generation unit 10 performs auto-calibration (ACAL) for a predetermined time period in response to the external command CMD.

The impedance control signal generation unit 10 activates an internal signal (that is, a calibration end signal CALEND) for defining the end of initial auto-calibration which is performed according to the external command CMD generated in the initial system operation.

The storage unit 20 latches and outputs the impedance control signals PCODEi<0:N> in response to an update pulse signal PULSE_UPD.

The update pulse signal PULSE_UPD may be generated in the process of auto-calibration which is performed according to the external command CMD generated in the auto-refresh operation.

The impedance control signals PCODEi<0:N> outputted from the storage unit 20 are provided to a data input/output driver, so that the impedance of the data input/output driver is calibrated.

The impedance control signal generation circuit 1 according to the conventional art latches and outputs the impedance control signals PCODEi<0:N>, which have been generated by the impedance control signal generation unit 10, whenever the update pulse signal PULSE_UPD is generated.

When the impedance control signals PCODEi<0:N> have an abnormal value out of a normal range, the impedance of the data input/output driver may also have an abnormal value.

Specifically, since the operation of the impedance control signal generation unit 10 in the auto-refresh operation is significantly affected by power noise, it is highly probable that an impedance control signal generated at a corresponding time point will have an abnormal value.

SUMMARY

An impedance control signal generation circuit and an impedance control method of a semiconductor circuit, which can substantially prevent an abnormal impedance control signal from being generated, are described herein.

In one embodiment of the present invention, an impedance control signal generation circuit includes an impedance control signal generation unit configured to generate an impedance control signal in response to a command, a storage unit configured to latch and output the impedance control signal in response to an update pulse signal, a control unit configured to determine whether the impedance control signal is abnormal, or within a predetermined range, and generate an update enable signal according to a determination result, and a prohibition unit configured to control input of the update pulse signal to the storage unit in response to the update enable signal.

In another embodiment of the present invention, a method for controlling impedance of a semiconductor circuit comprises generating an impedance control signal upon receipt of a command, generating an initial impedance control signal from the impedance control signal, generating a reference signal by using the initial impedance control signal generated according to initial auto-calibration performed in an initial operation of the semiconductor circuit, determining whether the impedance control signal is within a predetermined range by comparing an impedance control signal with the reference signal, and prohibiting update of the impedance control signal when it is determined that the impedance control signal is not within the predetermined range, wherein impedance of an input/output driver is calibrated according to the impedance control signal when the impedance control signal is not prohibited.

In another embodiment of the present invention, an impedance control signal generation circuit includes a storage unit configured to latch and output an impedance control signal in response to an update pulse signal, a control unit configured to generate a reference signal by using an initial impedance control signal generated from the impedance control signal according to initial auto-calibration performed in an initial operation of a semiconductor circuit, and generate an update enable signal by comparing the impedance control signal generated according to auto-calibration after the initial auto-calibration with the reference signal, and a prohibition unit configured to prohibit the update pulse signal from being inputted to the storage unit in response to the update enable signal.

BRIEF DESCRIPTION OF THE DRAWINGS

Features, aspects, and embodiments are described in conjunction with the attached drawings, in which.

DETAILED DESCRIPTION

Hereinafter, an impedance control signal generation circuit and an impedance control method of a semiconductor circuit will be described in detail with reference to the accompanying drawings through exemplary embodiments.

Signals may be active low or active high. An active low signal may be at a low voltage level when asserted and at a high voltage level when deasserted. An active high signal may be at a high voltage level when asserted and at a low voltage level when deasserted. Activated and deactivated may also be used in place of asserted and deasserted, respectively.

Figure 2:
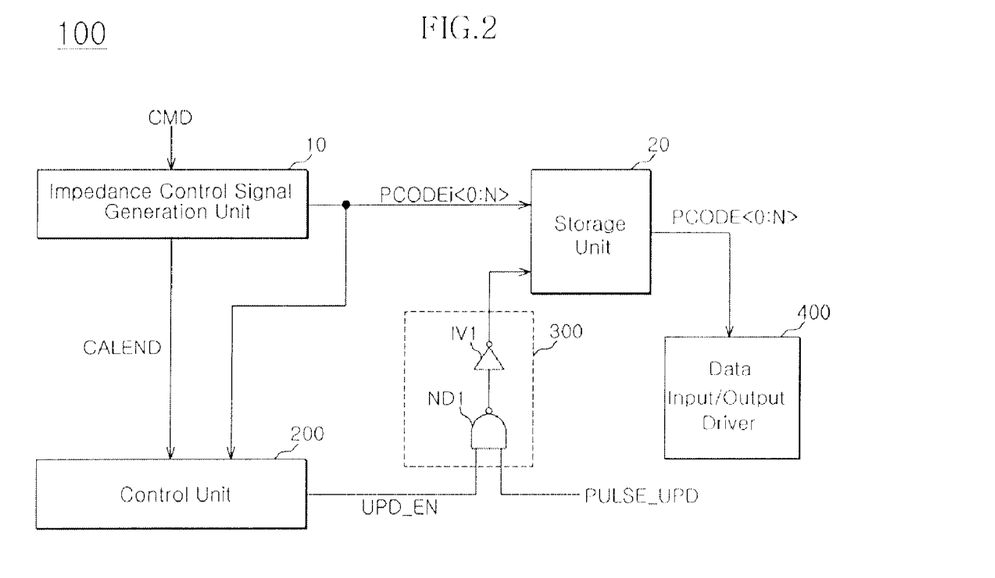
FIG. 2 is a block diagram of an impedance control signal generation circuit according to an embodiment of the present invention.

Referring to FIG. 2, an impedance control signal generation circuit 100 according to an embodiment of the invention includes an impedance control signal generation unit 10, a storage unit 20, a control unit 200, and a prohibition unit 300.

The impedance control signal generation unit 10 is configured to generate impedance control signals PCODEi<0:N> in response to an external command CMD.

The external command CMD may be generated in an initial system operation or an auto-refresh operation.

The impedance control signal generation unit 10 activates an internal signal (that is, a calibration end signal CALEND) for defining the end of initial auto-calibration which is performed according to the external command CMD generated in the initial system operation.

The storage unit 20 is configured to latch and output the impedance control signals PCODEi<0:N> in response to an update pulse signal PULSE_UPD. Various embodiments of the invention may also generate the pulse signal PULSE_UPD in the impedance control signal generation unit 10.

The impedance control signals PCODEi<0:N> outputted from the storage unit 20 are provided to a data input/output driver 400, thereby calibrating the impedance of the data input/output driver 400.

The impedance control signal generation unit 10 and the storage unit 20 may have configurations substantially equal to those of the impedance control signal generation unit 10 and the storage unit 20 illustrated in FIG. 1.

The control unit 200 is configured to determine whether the impedance control signals PCODEi<0:N> are abnormal and generate an update enable signal UPD_EN according to a determination result.

The control unit 200 is configured to activate the update enable signal UPD_EN when the impedance control signals PCODEi<0:N> have a value in a predetermined range.

The prohibition unit 300 is configured to prohibit the update pulse signal PULSE_UPD from being inputted to the storage unit 20 when the update enable signal UPD_EN is deactivated.

The prohibition unit 300 includes a NAND gate ND1 and an inverter IV1.

The NAND gate ND1 is configured to receive the update enable signal UPD_EN and the update pulse signal PULSE_UPD.

The inverter IV1 is configured to invert and output the output of the NAND gate ND1.

Figure 3:
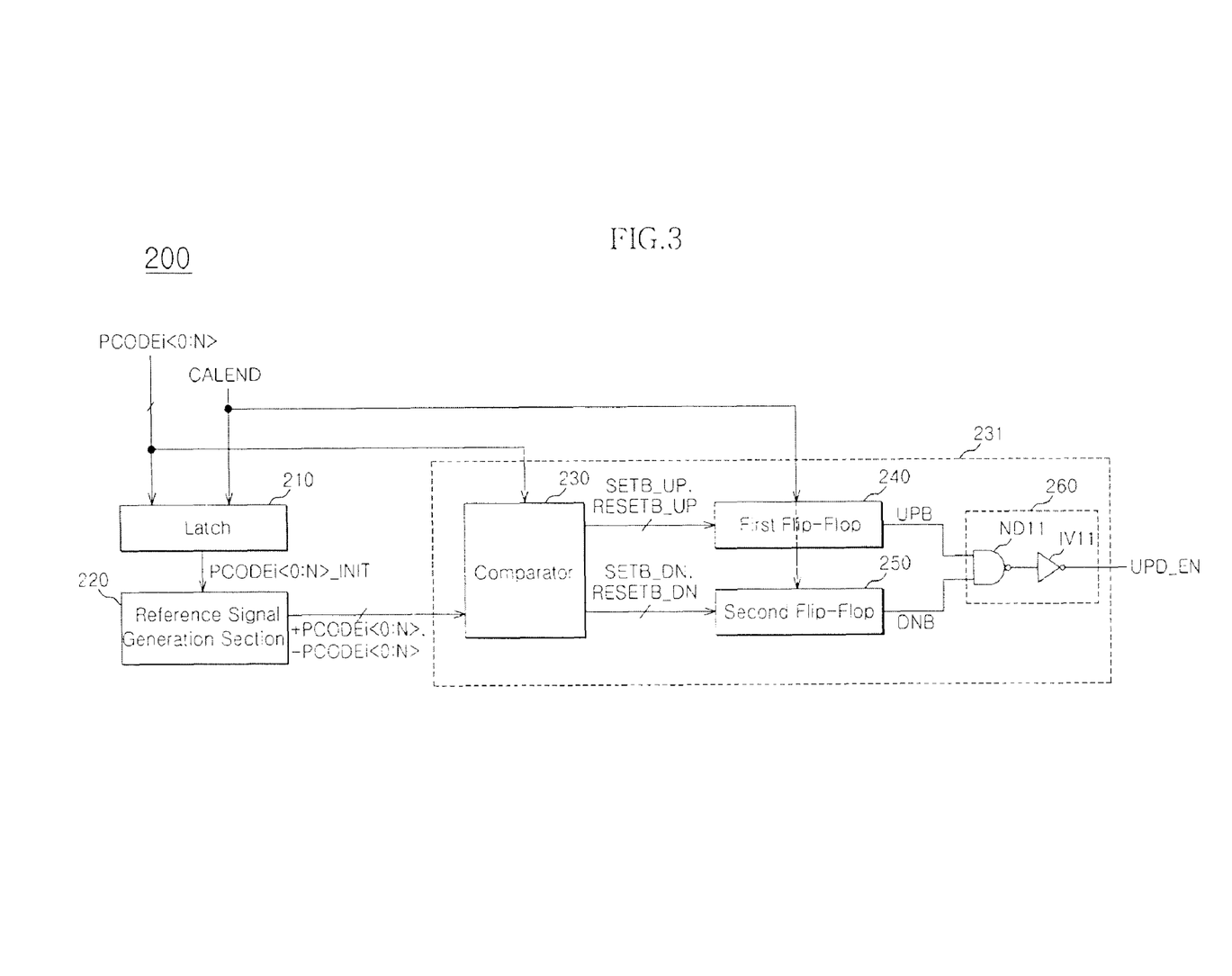
FIG. 3 is a block diagram illustrating the internal configuration of the control unit illustrated in FIG. 2.

Referring to FIG. 3, the control unit 200 includes a latch 210, a reference signal generation section 220, and a signal generation section 231.

The latch 210 is configured to latch the impedance control signals PCODEi<0:N> in response to the calibration end signal CALEND and generate initial impedance control signals PCODEi<0:N>_INIT.

The reference signal generation section 220 is configured to generate a plurality of reference signals, that is, upper limit reference signals +PCODEi<0:N> and lower limit reference signals PCODEi<0:N>, by using the initial impedance control signals PCODEi<0:N>_INIT.

The reference signal generation section 220 is configured to add a predetermined value (for example, a decimal number 8) to the initial impedance control signals PCODEi<0:N>_INIT and subtract the predetermined value from the initial impedance control signals PCODEi<0:N>_INIT, and generate the upper limit reference signals +PCODEi<0:N> and the lower limit reference signals −PCODEi<0:N>.

The signal generation section 231 is configured to generate the update enable signal UPD_EN according to results obtained by comparing the impedance control signals PCODEi<0:N> with the upper limit reference signals +PCODEi<0:N> and the lower limit reference signals −PCODEi<0:N>.

The signal generation section 231 includes a comparator 230, a first flip-flop 240, a second flip-flop 250, and a signal combination part 260.

The comparator 230 is configured to compare the impedance control signals PCODEi<0:N> with the upper limit reference signals +PCODEi<0:N> and the lower limit reference signals −PCODEi<0:N>, and generate a plurality of comparison signals, that is, first comparison signals SETB_UP and RESETB_UP and second comparison signals SETB_DN and RESETB_DN.

The comparator 230 activates the first comparison signal SETB_UP when the value of the impedance control signals PCODEi<0:N> is equal to or greater than the value of the upper limit reference signals +PCODEi<0:N>.

The comparator 230 activates the first comparison signal RESETB_UP when the value of the impedance control signals PCODEi<0:N> is less than the value of the upper limit reference signals +PCODEi<0:N>.

The comparator 230 activates the second comparison signal SETB_DN when the value of the impedance control signals PCODEi<0:N> is equal to or less than the value of the lower limit reference signals −PCODEi<0:N>.

The comparator 230 activates the second comparison signal RESETB_DN when the value of the impedance control signals PCODEi<0:N> is greater than the value of the lower limit reference signals −PCODEi<0:N>.

The first flip-flop 240 is configured to generate an upper limit detection signal UPB in response to the first comparison signals SETB_UP and RESETB_UP.

The first flip-flop 240 is configured to activate the upper limit detection signal UPB in response to the first comparison signal SETB_UP and deactivate the upper limit detection signal UPB in response to the first comparison signal RESETB_UP.

The second flip-flop 250 is configured to generate a lower limit detection signal DNB in response to the second comparison signals SETB_DN and RESETB_DN.

The second flip-flop 250 is configured to activate the lower limit detection signal DNB in response to the second comparison signal SETB_DN and deactivate the lower limit detection signal DNB in response to the second comparison signal RESETB_DN.

The signal combination part 260 is configured to combine the upper limit detection signal UPB with the lower limit detection signal DNB and generate the update enable signal UPD_EN.

The signal combination part 260 is configured to activate the update enable signal UPD_EN only when the upper limit detection signal UPB and the lower limit detection signal DNB are deactivated.

Figure 4:
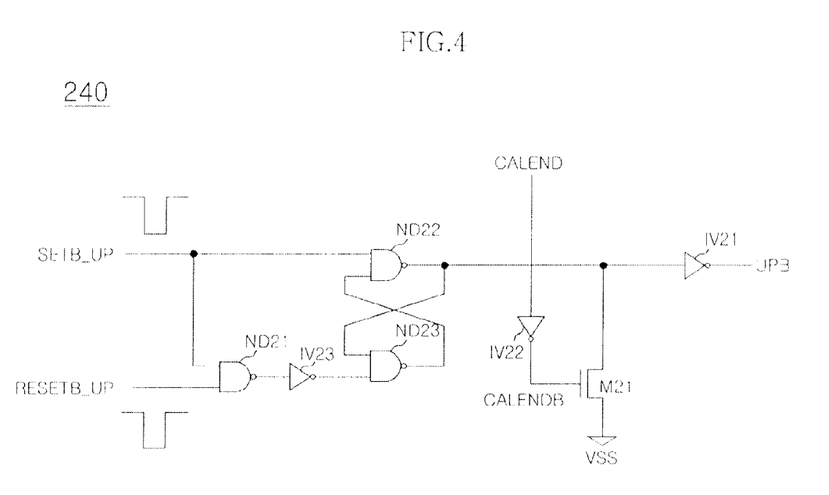
FIG. 4 is a circuit diagram of the first flip-flop illustrated in FIG. 3.

Referring to FIG. 4, the first flip-flop 240 includes a plurality of NAND gates ND21 to ND23, a plurality of inverters IV21 to IV23, and a transistor M21.

In the initial auto-calibration, the inverter IV22 and the transistor M21 allow the upper limit detection signal UPB to be substantially maintained at a deactivated level, that is, a logic high level, by a calibration end signal CALEND at a logic low level.

After the initial auto-calibration is ended, the transistor M21 is turned off by a calibration end signal CALEND at a logic high level, and the logic level of the upper limit detection signal UPB is determined according to the first comparison signals SETB_UP and RESETB_UP.

The second flip-flop 250 may have a configuration substantially equal to that of the first flip-flop 240 illustrated in FIG. 4.

Meanwhile, according to another embodiment of the invention, a control unit 201 may have a configuration different from that of the control unit 200 illustrated in FIG. 3.

Figure 5:
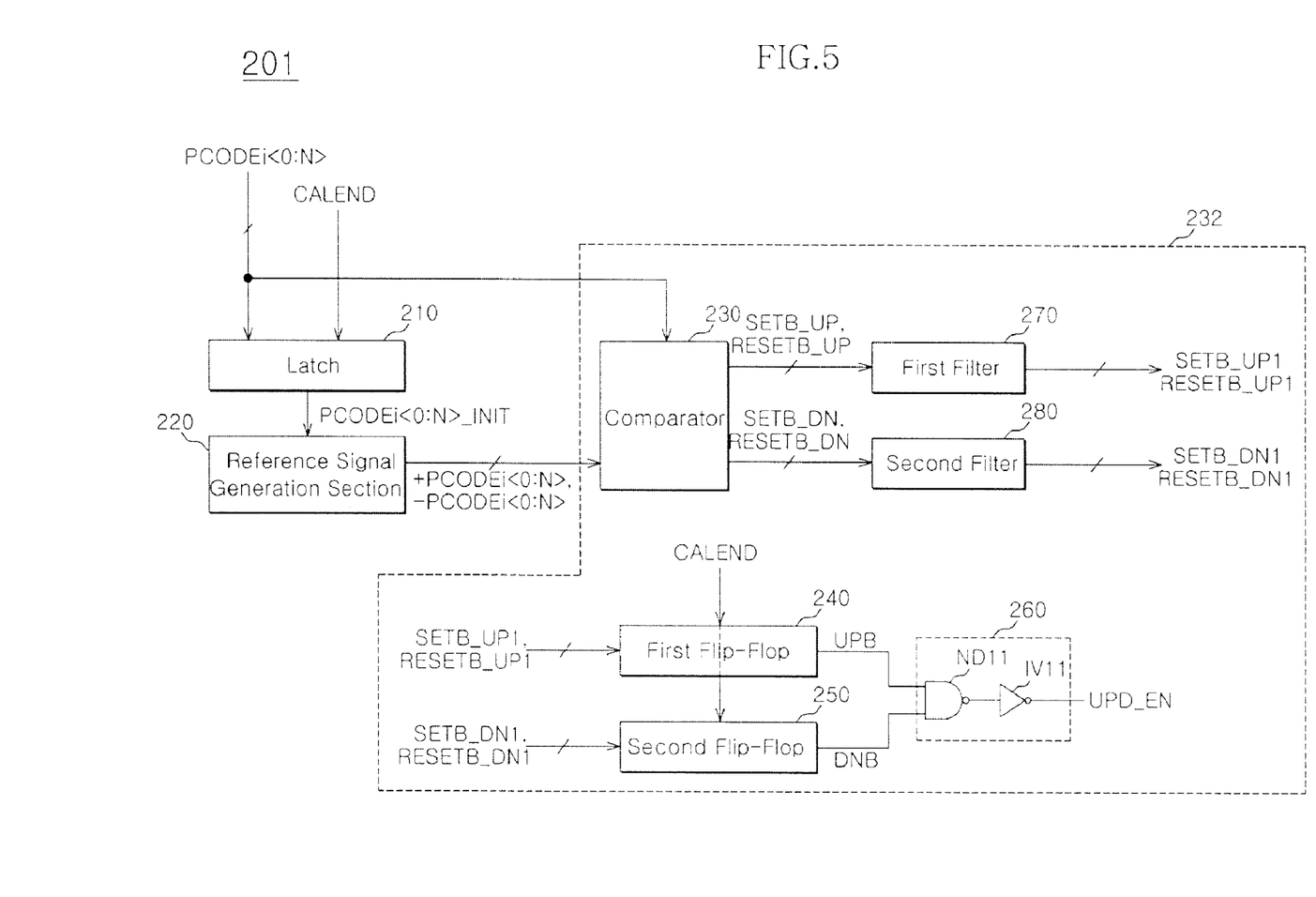
FIG. 5 is a block diagram illustrating the internal configuration of a control unit according to another embodiment.

Referring to FIG. 5, the control unit 201 may have a configuration substantially equal to that of the control unit 200 illustrated in FIG. 3, except that a first filter 270 and a second filter 280 are provided between a comparator 230 of a signal generation section 232 and a first flip-flop 240/a second flip-flop 250.

Upper limit reference signals +PCODEi<0:N> and lower limit reference signals −PCODEi<0:N> are generated by adding a predetermined value to initial impedance control signals PCODEi<0:N>_INIT and subtracting the predetermined value from the initial impedance control signals PCODEi<0:N>_INIT.

However, a timing error may occur in generation of the impedance control signals PCODEi<0:N> and the upper limit reference signals +PCODEi<0:N>/the lower limit reference signals −PCODEi<0:N>.

Noise, that is, glitch may exist in the first comparison signals SETB_UP and RESETB_UP and the second comparison signals SETB_DN and RESETB_DN due to the timing error in the impedance control signals PCODEi<0:N> and the upper limit reference signals +PCODEi<0:N>/the lower limit reference signals −PCODEi<0:N>.

The first filter 270 is configured to output signals SETB_UP1 and RESETB_UP1 obtained by removing the glitch from the first comparison signals SETB_UP and RESETB_UP.

The second filter 280 is configured to output signals SETB_DN1 and RESETB_DN1 obtained by removing the glitch from the second comparison signals SETB_DN and RESETB_DN.

The operation of the impedance control signal generation circuit having the above configuration according to the embodiment of the invention will be described with reference to FIGS. 2 to 6 below.

The initial auto-calibration is performed according to the external command CMD generated in the initial system operation.

As the initial auto-calibration is ended, the calibration end signal CALEND is activated.

As the calibration end signal CALEND is activated, the latch 210 illustrated in FIG. 3 latches the impedance control signals PCODEi<0:N> outputted from the impedance control signal generation unit 10 and outputs the initial impedance control signals PCODEi<0:N>_INIT.

The reference signal generation section 220 adds the predetermined value to the initial impedance control signals PCODEi<0:N>_INIT and subtracts the predetermined value from the initial impedance control signals PCODEi<0: N>_INIT, thereby generating the upper limit reference signals +PCODEi<0:N> and the lower limit reference signals −PCODEi<0:N>.

Then, the impedance control signal generation unit 10 performs the auto-calibration in response to the external command CMD generated whenever the auto-refresh operation is performed, resulting in a change in the value of the impedance control signals PCODEi<0:N>.

The comparator 230 compares the impedance control signals PCODEi<0:N> with the upper limit reference signals +PCODEi<0:N> and the lower limit reference signals −PCODEi<0:N>, thereby generating the first comparison signals SETB_UP and RESETB_UP and the second comparison signals SETB_DN and RESETB_DN.

When it is assumed that the value of the initial impedance control signals PCODEi<0:N>_INIT is '20' and a value set in the reference signal generation section 220 is '8', the value of the upper limit reference signals +PCODEi<0:N> is '28' and the value of the lower limit reference signals −PCODEi<0: N> is '12'.

For example, when the value of the impedance control signals PCODEi<0:N> generated by the impedance control signal generation unit 10 is '28', the comparator 230 activates the first comparison signal SETB_UP.

The first flip-flop 240 illustrated in FIG. 4 activates the upper limit detection signal UPB in response to the activation of the first comparison signal SETB_UP.

That is, the upper limit detection signal UPB is activated by detecting that the value of the impedance control signals PCODEi<0:N> deviates from a predetermined upper limit value.

Furthermore, when the value of the impedance control signals PCODEi<0:N> is '12', the comparator 230 activates the second comparison signal SETB_DN, so that the lower limit detection signal DNB is activated.

That is, the lower limit detection signal DNB is activated by detecting that the value of the impedance control signals PCODEi<0:N> deviates from a predetermined lower limit value.

As described above, according to the embodiment of the invention, when any one of the upper limit detection signal UPB and the lower limit detection signal DNB is activated, the update enable signal UPD_EN is deactivated.

Figure 6:
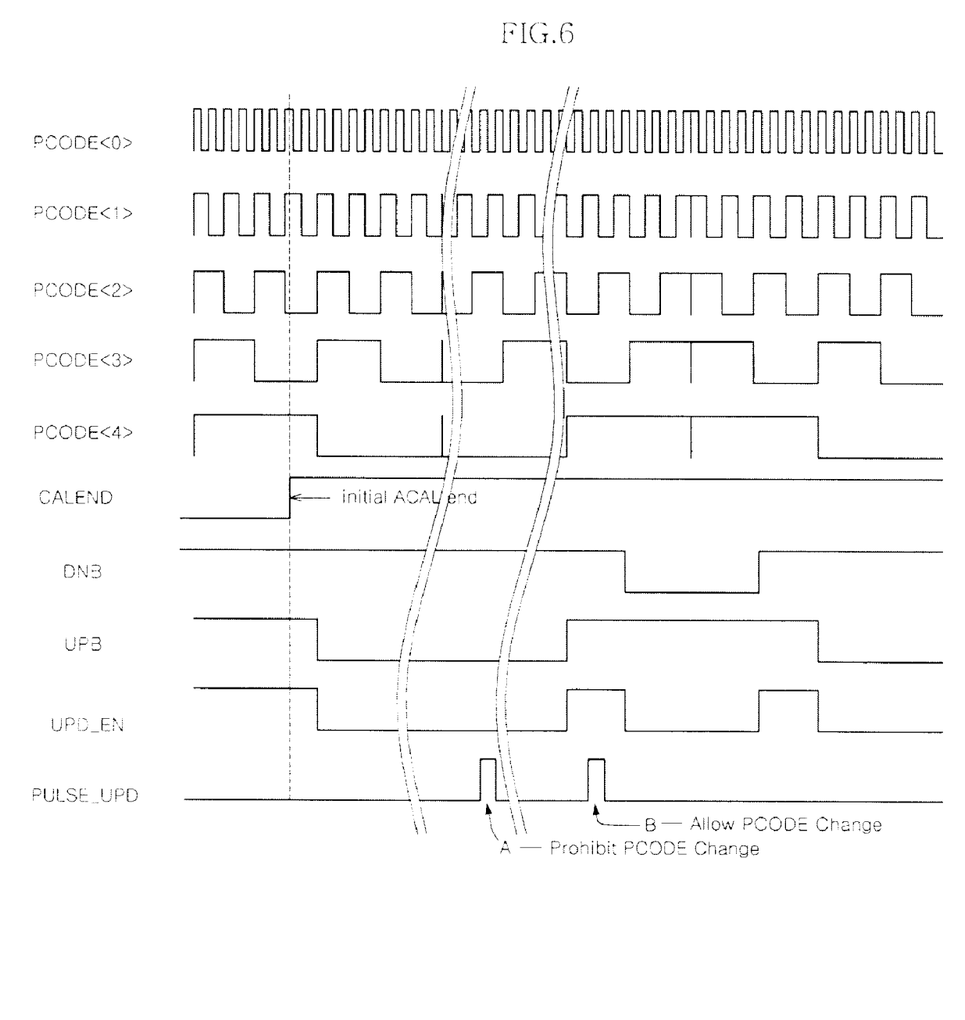
FIG. 6 is a diagram illustrating the operation timing of an impedance control signal generation circuit according to an embodiment of the present invention.

Thus, as indicated by 'A' of FIG. 6, although the update pulse signal PULSE_UPD has been generated, since the update enable signal UPD_EN is in a deactivate state, the value stored in the storage unit 20 is not updated.

Meanwhile, when the value of the impedance control signals PCODEi<0:N> outputted by the impedance control signal generation unit 10 is '27' or less, the comparator 230 activates the first comparison signal RESETB_UP.

The first flip-flop 240 illustrated in FIG. 4 deactivates the upper limit detection signal UPB in response to the activation of the first comparison signal RESETB_UP.

That is, the upper limit detection signal UPB is deactivated by detecting that the value of the impedance control signals PCODEi<0:N> does not deviate from the predetermined upper limit value.

Furthermore, when the value of the impedance control signals PCODEi<0:N> is '11' or more, the comparator 230 activates the second comparison signal RESETB_DN, so that the lower limit detection signal DNB is deactivated.

That is, the lower limit detection signal DNB is deactivated by detecting that the value of the impedance control signals PCODEi<0:N> does not deviate from the predetermined lower limit value.

As described above, according to the embodiment of the invention, only when both the upper limit detection signal UPB and the lower limit detection signal DNB are deactivated, the update enable signal UPD_EN is activated.

Thus, as indicated by 'B' of FIG. 6, since the update enable signal UPD_EN is in an activate state, the impedance control signals PCODEi<0:N> outputted by the impedance control signal generation unit 10 are stored in the storage unit 20 illustrated in FIG. 2 in response to the update pulse signal PULSE_UPD.

According to the embodiment of the invention, an impedance control signal is provided to a data input/output driver only when the impedance control signal has a normal value, so that the impedance of the data input/output driver is stabilized, resulting in the improvement of the operation performance of a semiconductor circuit using the data input/output driver.

Various embodiments of the invention may have been described where certain functionalities are performed by certain units. However, various embodiments may group different functionalities differently. For example, the latch 310 in FIG. 3 is described as being part of the control unit 200. However, an embodiment of the invention may have the latch 310 as part of the impedance control signal generation unit 10 in FIG. 1. Accordingly, the impedance control signal generation unit 10 may generate the impedance control signal and the initial impedance control signal.

While certain embodiments have been described above, it will be understood to those skilled in the art that the embodiments described are by way of example only. Accordingly, the impedance control signal generation circuit and the impedance control method of a semiconductor circuit described herein should not be limited based on the described embodiments. Rather, the impedance control signal generation circuit and the impedance control method of a semiconductor circuit described herein should only be limited in light of the claims that follow when taken in conjunction with the above description and accompanying drawings.

What is claimed is:

1. An impedance control signal generation circuit comprising:
    an impedance control signal generation unit configured to generate an impedance control signal in response to a command;
    a storage unit configured to latch the impedance control signal in response to an update pulse signal and output the latched impedance control signal to a data input/output driver;
    a control unit configured to determine whether the impedance control signal is within a predetermined range and generate an update enable signal according to a determination result; and
    a prohibition unit configured to control input of the update pulse signal to the storage unit in response to the update enable signal.

2. The impedance control signal generation circuit according to claim 1, wherein the command includes a command generated according to an initial system operation and a command generated according to an auto-refresh operation.

3. The impedance control signal generation circuit according to claim 1, wherein output of the storage unit is provided to the data input/output driver.

4. The impedance control signal generation circuit according to claim 1, wherein the impedance control signal generation unit is configured to generate a calibration end signal for defining end of initial auto-calibration which is performed according to the command generated in the initial system operation.

5. The impedance control signal generation circuit according to claim 4, wherein the control unit comprises:
    a latch configured to latch the impedance control signal in response to the calibration end signal and generate an initial impedance control signal;
    a reference signal generation section configured to generate a reference signal by using the initial impedance control signal; and
    a signal generation section configured to generate the update enable signal by comparing the impedance control signal with the reference signal.

6. The impedance control signal generation circuit according to claim 5,
    wherein the reference signal includes a plurality of reference signals, and
    wherein the signal generation section comprises:
    a comparator configured to compare the impedance control signal with the plurality of reference signals and generate a plurality of comparison signals;
    a plurality of flip-flops configured to generate a plurality of detection signals in response to the plurality of comparison signals; and
    a signal combination part configured to combine the plurality of detection signals with each other and generate the update enable signal.

7. The impedance control signal generation circuit according to claim 6, wherein the signal combination part is configured to activate the update enable signal when the plurality of detection signals are deactivated.

8. The impedance control signal generation circuit according to claim 6, wherein the signal generation section further comprises:
    a plurality of filters which are configured to provide the plurality of flip-flops with the plurality of comparison signals outputted from the comparator after removing noise from the plurality of comparison signals.

9. The impedance control signal generation circuit according to claim 5,
    wherein the reference signal includes a plurality of reference signals, and
    wherein the reference signal generation section is configured to add a predetermined value to the initial impedance control signal or subtract the predetermined value from the initial impedance control signal, and generate the plurality of reference signals.

10. The impedance control signal generation circuit according to claim 1, wherein the control unit is configured to activate the update enable signal when the impedance control signal has a value in the predetermined range.

11. The impedance control signal generation circuit according to claim 1, wherein the update pulse signal is generated in a process of auto-calibration which is performed according to a command generated in an auto-refresh operation.

12. An impedance control signal generation circuit comprising:

a storage unit configured to latch an impedance control signal in response to an update pulse signal and output the latched impedance control signal to a data input/output driver;

a control unit configured to generate a reference signal by using an initial impedance control signal generated from the impedance control signal according to initial auto-calibration performed in an initial operation of a semiconductor circuit, and generate an update enable signal by comparing the impedance control signal generated according to auto-calibration after the initial auto-calibration with the reference signal; and a prohibition unit configured to prohibit the update pulse signal from being inputted to the storage unit in response to the update enable signal.

13. The impedance control signal generation circuit according to claim 12, wherein the control unit comprises:

a latch configured to latch the impedance control signal to output the initial impedance control signal;

a reference signal generation section configured to generate the reference signal by using the initial impedance control signal; and a signal generation section configured to generate the update enable signal by comparing the impedance control signal with the reference signal.

14. The impedance control signal generation circuit according to claim 13, wherein the latch is configured to latch the impedance control signal in response a calibration end signal for defining end of initial auto-calibration.

15. The impedance control signal generation circuit according to claim 13, wherein the reference signal includes a plurality of reference signals, and wherein the signal generation section comprises:

a comparator configured to compare the impedance control signal with the plurality of reference signals and generate a plurality of comparison signals;

a plurality of flip-flops configured to generate a plurality of detection signals in response to the plurality of comparison signals; and a signal combination part configured to combine the plurality of detection signals with each other and generate the update enable signal.

16. The impedance control signal generation circuit according to claim 15, wherein the signal generation section further comprises:

a plurality of filters which are configured to provide the plurality of flip-flops with the plurality of comparison signals outputted from the comparator after removing noise from the plurality of comparison signals.

17. The impedance control signal generation circuit according to claim 13, wherein the reference signal includes a plurality of reference signals, and wherein the reference signal generation section is configured to add a predetermined value to the initial impedance control signal or subtract the predetermined value from the initial impedance control signal, and generate the plurality of reference signals.

18. The impedance control signal generation circuit according to claim 12, wherein the update pulse signal is generated in a process of auto-calibration which is performed according to a command generated in an auto-refresh operation.

19. The impedance control signal generation circuit according to claim 12, further comprising:

an impedance control signal generation unit which is configured to generate the initial impedance control signal and the impedance control signal in response to a command.

* * * * *